United States Patent
Ciccone et al.

(10) Patent No.: US 6,173,436 B1
(45) Date of Patent: *Jan. 9, 2001

(54) STANDARD CELL POWER-ON-RESET CIRCUIT

(75) Inventors: John C. Ciccone, Scottsdale; Bing L. Yup, Phoeniz, both of AZ (US)

(73) Assignee: VLSI Technology, Inc., San Jose, CA (US)

(*) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/957,671

(22) Filed: Oct. 24, 1997

(51) Int. Cl.⁷ .................................................. G06F 17/10

(52) U.S. Cl. .................................. 716/19; 716/1; 716/11; 727/142; 727/143; 726/41; 726/47; 726/101

(58) Field of Search ......................... 395/500.02, 500.03, 395/500.04, 500.09, 500.11; 326/8, 41, 47, 101; 716/1, 11, 19; 327/142, 143, 205

(56) References Cited

U.S. PATENT DOCUMENTS

| | | | |
|---|---|---|---|
| 4,224,530 | * 9/1980 | Simcoe et al. | 307/141 |
| 4,276,483 | * 6/1981 | Hayden | 307/10.1 |
| 4,424,745 | * 1/1984 | Magorian et al. | 102/215 |
| 4,633,107 | * 12/1986 | Norsworthy | 327/198 |
| 5,146,117 | * 9/1992 | Larson | 326/49 |
| 5,202,591 | * 4/1993 | Walden | 326/8 |
| 5,243,233 | * 9/1993 | Cliff | 327/143 |
| 5,559,458 | * 9/1996 | Holler, Jr. | 327/143 |
| 5,696,920 | * 12/1997 | Miyata et al. | 712/201 |
| 5,737,236 | * 4/1998 | Maziasz et al. | 395/500.09 |
| 5,760,624 | * 6/1998 | McClintock | 327/143 |
| 5,783,846 | * 7/1998 | Baukus et al. | 257/204 |
| 5,912,428 | * 6/1999 | Patti | 102/215 |

OTHER PUBLICATIONS

Gupta, A.; Siang–Chun The; Hayes, J.P. "XPRESS: A Cell Layout Generator with Integrated Transistor Folding", European Design and Test Conference, 1996. ED&TC96. Proceedings, 1996, pp. 393–400.*

Ryder, John D. Electronic Fundamentals and Applications, New Jersey, Prentice–Hall, 1976. pp. 438–440. TK7815.R92 1976.*

Refioglu, H. Iihan. "Timing Circuits." in: Williams, Arthur B., Designer's Handbook of Integrated Circuits (New York, McGraw–Hill, 1984), pp. 6–8 to 6–9. TK7874.D476 1984.*

Aldridge, Hamil. "SSI Logic Circuits." in: Williams, Arthur D., Designer's Handbook of Integrated Circuits (new York, McGraw–Hill, 1984), pp 9–12, 9–20 to 9–23. TK7874.D476 1984.*

Alfke, Peter. "MSI Logic Circuits." in: Williams, Arthur D., Designer's Handbook of Integrated Circuits (New York, McGraw–Hill, 1984), pp. 10–61 to 10–63. TK7874.D476 1984.*

* cited by examiner

Primary Examiner—Paul R. Lintz
Assistant Examiner—Vuthe Siek
(74) Attorney, Agent, or Firm—Burns, Doane, Swecker & Mathis, L.L.P.

(57) ABSTRACT

A method of designing a reset circuit for a digital integrated circuit (IC) layout is described. The reset circuit is designed with the intention of making it visually non-detectable in the digital IC layout by implementing the reset circuit entirely in digital elements and then using standardized digital layout cells and routing such that the reset circuit is essentially non-discernible from the digital circuitry of the IC device layout. In addition, circuit elements are designed using devices having dimensions that are essentially the same as typical digital devices in the digital IC layout.

12 Claims, 5 Drawing Sheets

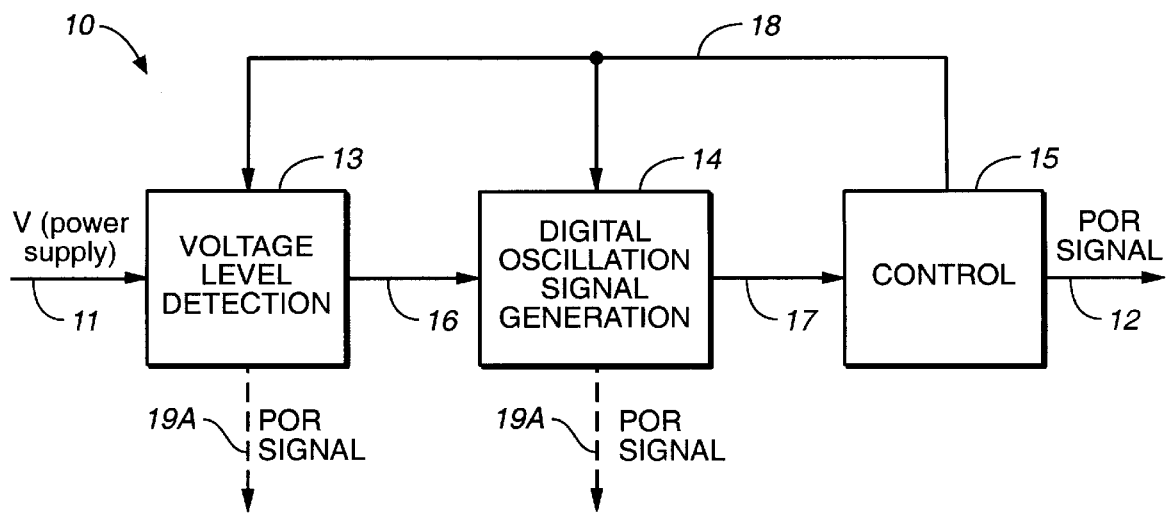
FIG._1
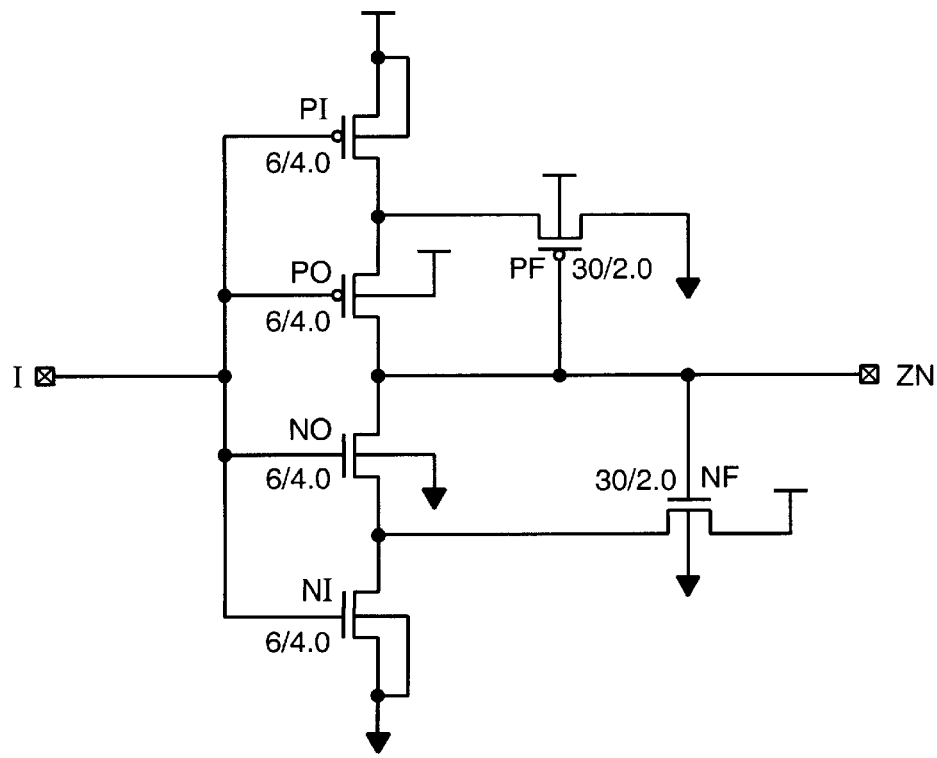
FIG._5
*(PRIOR ART)*

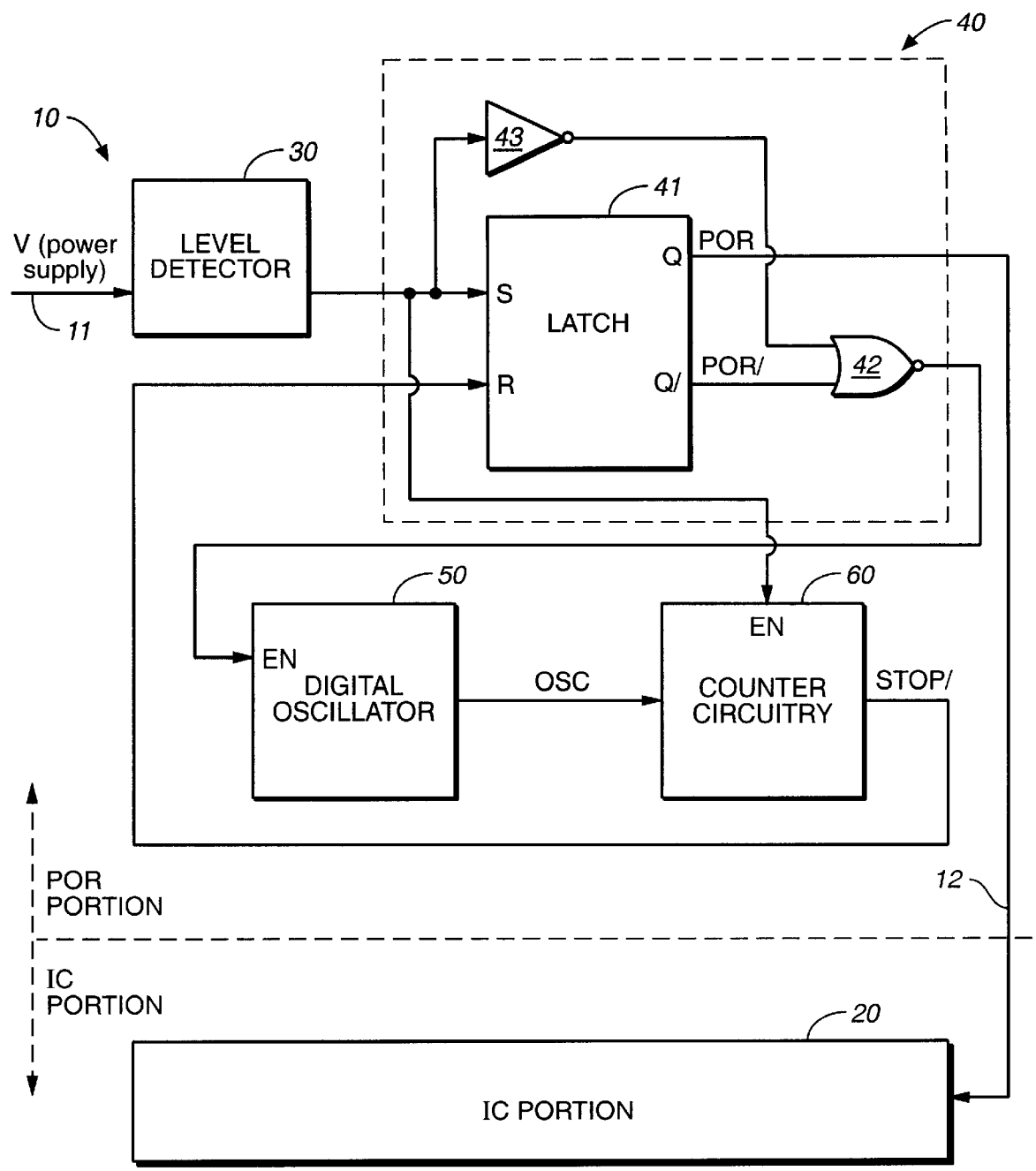
FIG._2

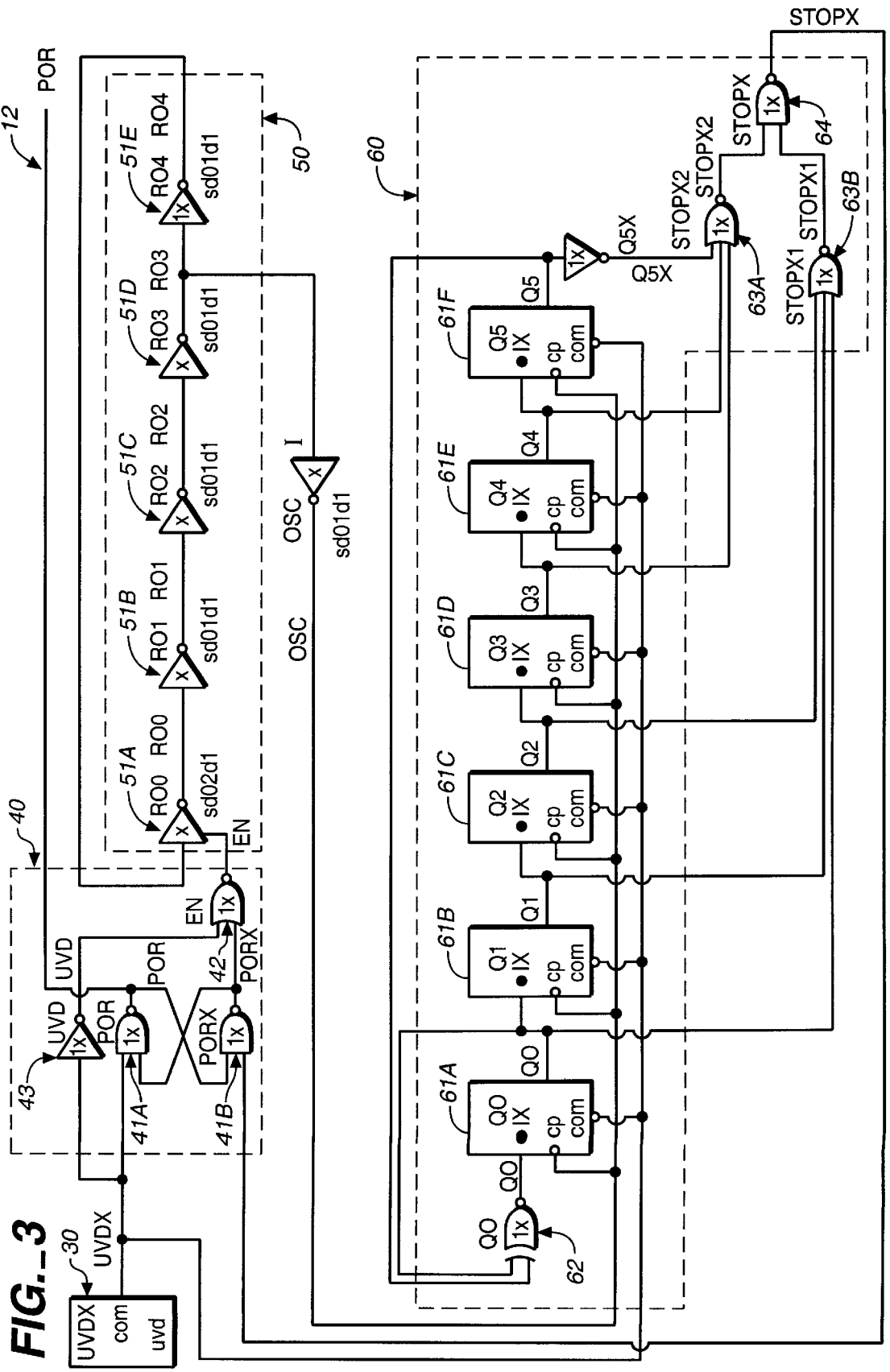
FIG._3

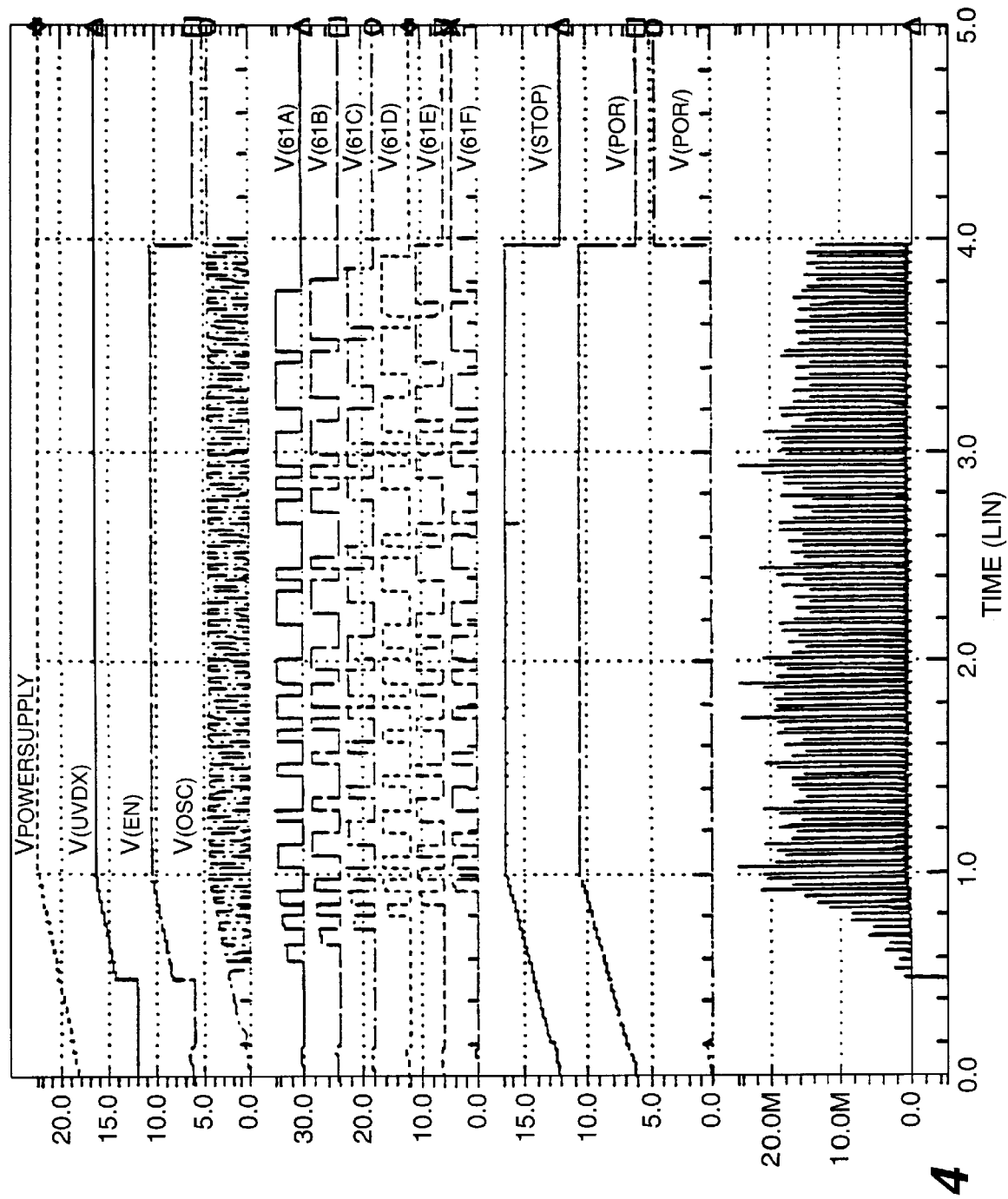
FIG._4

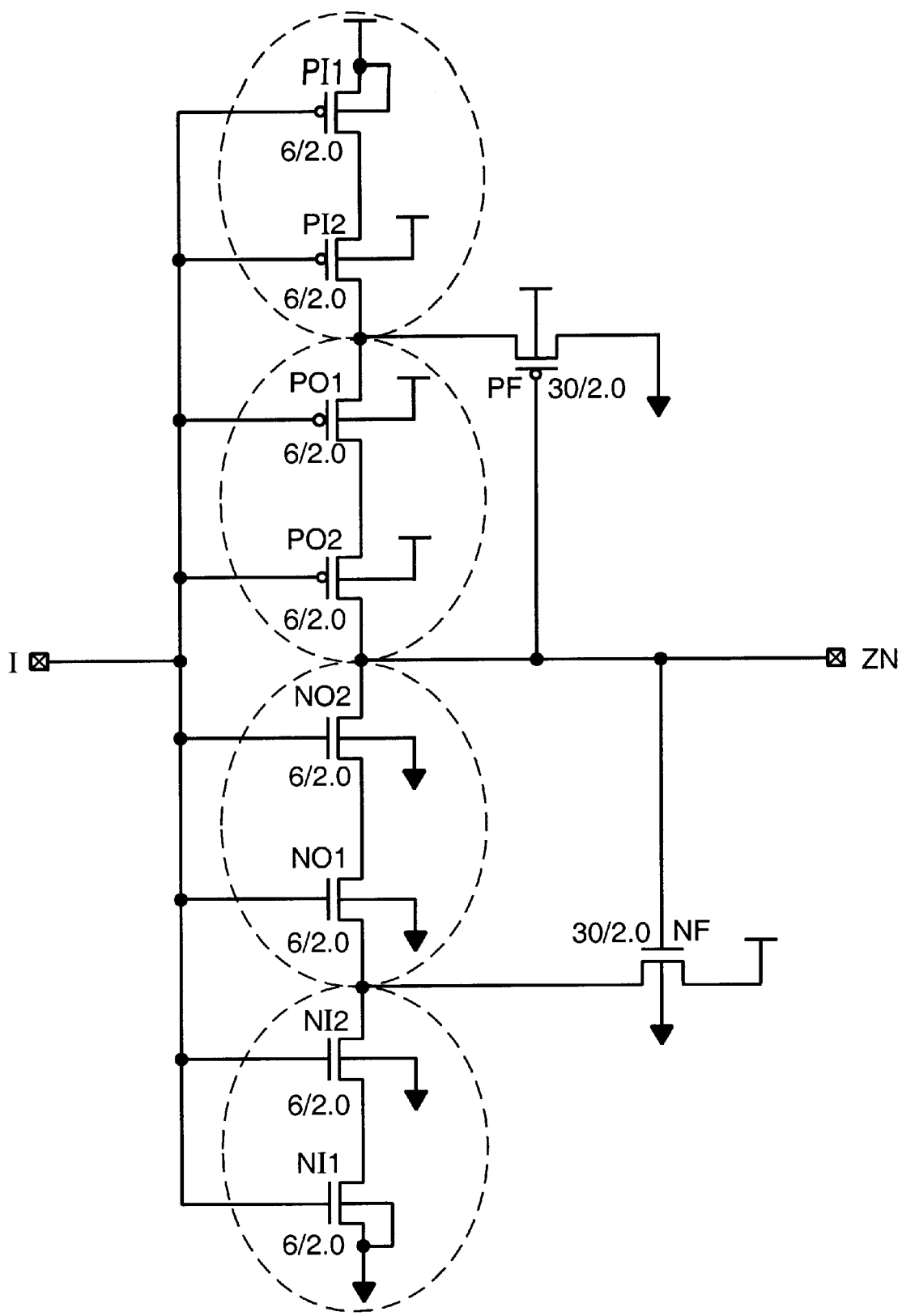
FIG._6

STANDARD CELL POWER-ON-RESET CIRCUIT

BACKGROUND OF THE INVENTION

1. Field of the Invention

The present invention relates to reset circuits and particularly to reset circuits used when ramping up the power supply voltage of a integrated circuit device.

2. State of the Art

In digital integrated circuits (ICs) it is often desirable, upon powering up, to reset portions of the IC so that given logic within the circuit is in a known state. However, when powering up an integrated circuit, the power supply voltage is often ramped up to the intended full level of the power supply voltage instead of directly applying full power. During this time, the integrated circuit is in an intermediate state and any reset signal generated while the circuit is being powered up may appear to be at a digital level other than the intended reset digital level. Consequently, the reset signal is generally provided to the remainder of the integrated circuit a short delay time after the power supply voltage has been applied to the power supply ports.

In general, reset circuitry (referred to as power-on reset (POR) circuitry) detects the power supply voltage as its being ramped to full power and delays the application of the reset signal for a given amount of time after the power supply has been applied. Currently, PORs are implemented as a RC circuit made up of resistive and capacitive elements. The power supply voltage is coupled to the input of the POR and the output of the POR is a delayed power supply signal which functions to reset the IC.

The physical appearance of the IC layout of the standard analog POR is easily identifiable within the integrated circuit chip. Specifically, when viewing an integrated digital circuit with a microscope, it is possible to identify the capacitive and resistive layout elements that make up the POR. In addition, the POR clearly appears as an analog circuit when compared to the remaining digital circuitry making up the IC. The disadvantage of being able to visually identify where the POR is located on the IC is that it provides a manner in which to determine other architectural aspects of the IC and potentially provides a manner in which to access the IC in a way not intended by the manufacturer. It is well known in the integrated circuit industry that reverse engineering has become a prevalent concern for IC designers and manufacturers and identifying the POR location is one means in which reverse engineering can be facilitated. Furthermore, knowing the location of the POR on a digital circuit can also provide a way in which to access or alter information stored within the integrated circuit thus presenting a potential security problem.

The present invention is a method of designing a POR to make it difficult or impossible to visually detect and locate within an integrated circuit layout.

SUMMARY OF THE INVENTION

A method of implementing a POR entirely out of digital elements so as to make it difficult to visually detect within an digital integrated circuit (IC) layout design is described.

In one embodiment of the present invention, each functional block of the POR is implemented using standard layout cells and devices used to design the remainder of the IC that the POR resides in.

In another embodiment of the present invention a digital circuit integrated layout has a first portion corresponding to a digitally designed POR circuit implemented using standardized layout cells and routing and a second portion corresponding to the remainder of the integrated circuit also implemented using standardized layouts cells and routing such that the POR circuit is visually non-discernible within the integrated circuit layout.

In another embodiment of the present invention, certain devices in the POR circuit are implemented so that they visually appear in the layout as these devices would in a digital circuit. For instance, in one embodiment, transistors within the digitally implemented POR that need to be designed with gate widths greater than the standard digital transistor gate width due to the PORs intrinsic analog nature are designed instead using two standard width transistors so as to give the appearance of a digital circuit instead an analog circuit.

In one embodiment of the digitally designed POR of the present invention the circuit includes a level detector for indicating when the power supply reaches a predetermined voltage level, an oscillation signal generator which is enabled when the power supply reaches the predetermined level and which, once enabled, generates a digital oscillation signal, and a control circuit for outputting the power-on-reset signal after a predetermined number of cycles of the oscillation signal.

In another embodiment of the digitally designed POR of the present invention the circuit includes a voltage level detector as described above, set/reset latching circuitry, an oscillator, and counting circuitry. The set/reset latching circuitry has its set input coupled to the output of the level detector and its rest input coupled to a STOP control signal. The oscillator, which is enabled by the latching circuitry when the power supply reaches the predetermined level, generates a digital oscillation signal. The digital oscillation signal is coupled to the counting circuitry which, after a predetermined number of cycles corresponding to a desired delay time, outputs the STOP control signal. Once the STOP control signal is provided to the reset input of the latching circuitry, the latching circuitry disables the oscillation signal generator and also outputs the power-on-reset signal to the remainder of the integrated circuit. The amount of delay that is desired can be varied by modifying the counting circuitry to count more or less cycles.

BRIEF DESCRIPTION OF THE DRAWINGS

FIG. 1 shows a first logical block diagram of one embodiment of the power-on-reset circuit of the present invention.

FIG. 2 shows a second logical block diagram of another embodiment of the power-on-reset circuit of the present invention.

FIG. 3 shows a schematic of another embodiment of the power-on-reset circuit of the present invention.

FIG. 4 shows a timing diagram of the embodiment of the power-on-reset circuit of the present invention shown in FIG. 3.

FIG. 5 shows a prior art Schmitt inverter circuit designed with transistors having dimensions that physically appear within a IC layout to have analog circuit transistor dimensions.

FIG. 6 shows a Schmitt inverter circuit redesigned to only have transistors with gate widths comparable to typical digital transistor gate widths so as to give the appearance of a digital transistor.

DESCRIPTION OF PREFERRED EMBODIMENTS

The present invention is a method of designing a power-on-reset circuit for a digital integrated circuit. The reset circuit is designed with the intention of making it visually non-detectable in a digital integrated circuit layout by designing the reset circuit entirely in digital elements and then implementing the reset circuit in a digital circuit layout using standardized digital layout cells and routing.

Hence, one embodiment of the present invention is an integrated circuit layout having a first portion making up the power-on-reset circuit which is implemented entirely using digital layout cells and routed using the standardized routing and a second portion making up the remainder of the digital circuit which is implemented using same digital layout cells and routing making the reset circuit visually non-detectable within the digital integrated circuit layout.

FIG. 1 shows a functional block diagram of a first basic embodiment of a power-on-reset (POR) circuit 10 designed entirely of digital elements so that it can be implemented in standardized digital layout cells. The diagram includes a voltage level detection block 13, a digital oscillation signal generation block 14, and a control block 15 for causing the power-on-reset signal to be generated after a predetermined delay. The power supply voltage is coupled to input 11 of the POR circuit 10 and POR circuit 10 outputs a power-on-reset signal on output 12. The power supply is ramped slowly so as not to damage the remainder of the devices within the integrated circuit. When the power supply reaches a predetermined level V(L) which assures that the POR is functioning, the detector outputs a digital signal 16 that enables the oscillation signal generation block to start generating an oscillation signal 17. The oscillation signal drives the control circuit such that after a predetermined number of cycles of the oscillation signal the control circuit generates the power-on-reset signal. The power-on-reset signal can also provide a feedback signal 18 to either reset or disable portions of the POR circuit. The number of cycles relates to the desired length of delay between the time the power supply reaches the predetermined level to the time the power-onreset signal is applied to the remainder of the integrated circuit device. Also shown in FIG. 1 are alternate POR signals 19A which indicates that the POR signal may be generated by either blocks 13 and 14 in response to feedback signal 18, instead of being generated by control block 15.

FIG. 2 shows a block diagram of another embodiment of the POR circuit 10 of the present invention including level detector 30, set/reset latching circuitry 40, digital oscillator 50, and counter circuitry 60. FIG. 2 shows $V_{power\ supply}$ being coupled to the input port 11 of the POR circuit 10 and shows POR circuit 10 outputting a POR signal on output port 12 to the integrated circuit 20. The POR circuit 10 functions to provide the POR signal on output port 12 a certain time interval after the power supply has reached a predetermined level. Hence, for instance, as $V_{power\ supply}$ is ramped from 0.0 volts to VDD and reaches a predetermined voltage level V(L) which is less than VDD, the POR circuit 10 will output a POR signal some time interval after V(L) has been reached.

Level detector 30 outputs a logical LOW voltage level when $V_{power\ supply}$ is less than the predetermined voltage level V(L). Hence initially, the S (i.e. set) input of the set/reset latching circuitry is LOW, causing the POR signal (Q of the set/reset circuitry) to be at a LOW logic level and the enable signal (EN) to be at a LOW logic level. The oscillator, having its enable input coupled to EN, is consequently off. In addition, the output of level detector 30 is also coupled to the enable input of counter circuitry 60. Consequently, with the output of the detector at a LOW state, counter circuitry 60 is also off causing it to output the inverse of stop control signal (STOP/), a HIGH logic level. Hence, when $V_{power\ supply}$ is less than V(L), POR is LOW, EN is LOW, and STOP/is HIGH. Furthermore, the oscillator 50 and counter circuitry 60 are off.

When $V_{power\ supply}$ reaches V(L), the output of detector 30 transitions high causing the set input of the latching circuitry to go HIGH and EN also to transition HIGH. With EN HIGH, oscillator 50 is enabled and begins outputting a digital oscillation signal (OSC) to counter circuitry 60. Counter circuitry 60 has its enable input coupled to the output of detector 30 such that it too is enabled when $V_{power\ supply}$ reaches V(L) and when OSC is provided to counter circuit 60 it begins counting the cycles of the OSC signal. The counter circuitry continues counting cycles until it reaches a predetermined number of cycles. This number of cycles corresponds to the desired delay time of the POR circuit. When the counter circuitry counts the predetermined number of cycles, it outputs a LOW STOP/signal to the reset input of the set/reset latching circuitry 40. This causes the latching circuit 40 to output a LOW EN signal disabling the oscillator 50, causing counter circuitry 60 to stop counting, and further causing the POR signal to be asserted to the remainder of the IC device 20.

As shown in FIG. 2, the set/reset latching circuitry 40 can be implemented using an S/R latch 41, a NOR gate 42, and an inverter 43. Hence, when both inputs of the NOR gate 42 are low, then EN is high. This occurs when the set input of the SR latch transitions HIGH (i.e. when the level detector detects when $V_{power\ supply} \geq V(L)$).

In other words, for $V_{power\ supply} < V(L)$, EN is LOW and the POR circuit is essentially disabled and POR is not asserted. When, $V_{power\ supply} \geq V(L)$, EN is high, and oscillator 50 and Counter Circuitry 60 begin counting. After the delay, the R input of the latch transitions LOW (i.e. when STOP/transitions LOW), the EN signal once again becomes LOW thereby disabling oscillator 50 and Counter 60, and asserting the POR signal.

FIG. 3 shows a second embodiment of the power-on-reset circuit 10 including detector 30, set/reset latching circuitry 40, oscillator 50, and counting circuitry 60. The set/reset latch is implemented with two cross-coupled NAND gates 41A and 41B. One of the inputs of NAND 41A is coupled to the output of detector 30 and the other input of NAND 41A is coupled to the output of NAND gate 41B. The output of NAND 41A is the POR signal. The NAND gate 41B has one input coupled to the output of NAND 41A and its other input coupled to the STOP/signal. As shown, detector 30 controls the set input (S) of the latching circuitry and the STOP/signal controls the reset input (R) of the latching circuitry.

NOR gate 42 generates the enable signal in response to the POR/signal and the inverse of the output of level detector 30. As shown, the output of NAND gate 41B (i.e. POR/) is coupled to the one input of NOR gate 42 and the other input of NOR gate 42 is coupled to the output of level detector 30 through inverter 43. When $V_{power\ supply}$ reaches V(L) the output of detector 30 transitions LOW-to-HIGH causing one input (UVD) of NOR gate 42 to transition HIGH-to-LOW. Initially, POR is in a HIGH state and POR/is in a LOW state such that the other input of NOR gate 42 is also LOW. As a result, the output of NOR gate 42, (i.e. EN signal) is driven HIGH.

The EN signal is coupled to digital oscillator 50 which is implemented as a ring oscillator including a set of series connected inverters 51A–51E in which the output of the last inverter 51E feeds back to the input of the first inverter 51A.

In one embodiment, inverters with hysteresis are used so that they can accommodate the ramping $V_{power\ supply}$ voltage levels. The EN signal enables the first inverter wherein when the first inverter is enabled it causes the ring oscillator to begin to output a digital oscillation signal, OSC. The output of the ring oscillator is taken from the output of the second to last inverter 51D and is coupled to the clocking input of a first D flip-flop 61A of the counting circuitry 60.

The counting circuitry 60 is designed to count 64 cycles of the clock signal and then generate a LOW STOP/signal. Circuitry 60 includes series coupled D flip-flops 61A–61F. It is well known in the field of digital circuit design that a D flip-flop functions to pass whatever is on its input to its output when it is clocked. Initially, the input of the first D flip-flop is coupled to the output of exclusive NOR gate 62 which has one of its inputs coupled to the output of the first D flip-flop 61A and the other coupled to the output of the last D flip-flop 61F. In addition, the reset inputs of each of the D flip-flops are coupled to the output of the level detector 30. Hence, when the output of the level detector 30 transitions HIGH, the outputs of all of the D flip-flops are set LOW and as a result, the output of gate 62 is HIGH. Consequently, when the first oscillation pulse is applied to the clock input of the first flip-flop 61A its output transitions from LOW-to-HIGH. As a result, a HIGH voltage level is applied to the input of the next flip-flop 61B and when it is clocked it too will pass the HIGH input to its output. This continues successively along the flip-flops. The output of the last flip-flop 61F feeds back to one of the inputs of exclusive NOR gate 62 and the cycle continues as long as the oscillator signal is applied. In one embodiment, the flip-flops continue to cycle for 64 oscillation signal cycles.

The outputs of flip-flops 61A–61F are coupled to the inputs of two NOR gates 63A and 63B which in turn have each of their outputs coupled to the input of NAND gate 64. When all of the outputs of the flip-flops 61A–61E have transitioned LOW and the output of the last flip-flop transitions HIGH, all of the inputs of NOR gates 63A and 63B will be LOW and consequently they will output a HIGH voltage level causing NAND gate 64 to output a LOW STOP/signal. The STOP/signal, which is coupled to the reset input of the latching circuitry causes the POR/signal to transition HIGH so that the EN signal transitions LOW and oscillator 50 is disabled thereby deactivating counting circuitry 60. In addition, with the reset signal set LOW, the POR signal transitions LOW thereby applying the reset signal to the remainder of the integrated circuit device. Note that the IC is reset with a low POR signal.

FIG. 4 shows the timing diagram of various signals as $V_{power\ supply}$ is ramped from 0.0–5.0 volts for the embodiment of the power-on-reset circuit shown in FIG. 3. For $V_{power\ supply} < V(L)$, the output of the level detector UVDX is held LOW as well as the EN signal. Consequently, the oscillator is disabled as well as the counting circuitry. The POR signal is initially in a logic HIGH state and is ramping up at the same rate as $V_{power\ supply}$. Furthermore, POR/is initially in a logic LOW state and the STOP/signal is ramping to an initial HIGH voltage level state.

When $V_{power\ supply} = V(L)$, the output of the level detector UVDX transitions from a LOW digital voltage level (i.e. 0.0 volts) to a HIGH digital voltage level. In addition, the EN signal transitions LOW-to-HIGH. It can be seen that since $V_{power\ supply}$ is still ramping towards 5.0 volts, the HIGH voltage level of the output of the detector is restricted to a voltage that is approximately equal to the current $V_{power\ supply}$ level. It should be further noted that as $V_{power\ supply}$ increases, so does the UVDX and EN signal.

Once the enable signal transitions high, oscillator 50 is enabled and begins generating the OSC signal. The OSC signal drives D flip-flops 61A–61F as shown. Once all of the flip-flops transition to a LOW level except for 61F, the STOP/signal transitions LOW causing POR to transition low. The integrated circuit portion 20 (FIG. 2) coupled to the POR signal is responsive to a HIGH-to-LOW transitioning signal and thus is reset when POR transitions LOW. In addition, POR/transitions HIGH causing the EN signal to transition LOW, disabling oscillator 50. As shown, the OSC signal no longer oscillates after POR/has transitioned HIGH. In addition, the output signals from flip-flop 61A–61F terminate when the OSC signal stops oscillating since the flip-flops are no longer clocked.

The embodiments shown in FIGS. 1–3 are one manner in which to implement a POR circuit in entirely digital elements. By implementing the POR circuit digitally, it can be realized within the IC layout using standardized digital library cells and standardized routing so that it is visually non-discernible from the remainder of the digital circuit IC design. It should be understood that any other digital elements can be substituted to implement the POR circuit as long as the elements can be realized with layout cells within the IC circuit such that the POR is visually non-discernible within the layout. Consequently variations to the implementation shown in FIGS. 1–3 are also within the scope of the present invention.

Another aspect of the present invention is designing circuit elements (e.g. Schmitt inverter) in the POR circuit using devices having essentially the same dimensions as devices in a typical digital circuit. For instance, FIG. 5 shows an example of a conventional circuit schematic for a Schmitt inverter which includes transistors PI, PO, NI, NO having gate widths of $4\lambda$ (where $\lambda$ is proportional to the minimum gate width in $\lambda$m). Gate widths in this range are generally used only in analog circuits because of these circuit's relatively high voltage and current requirements. However, in a digital circuit layout, transistors typically have gate widths in the range of $2\lambda$ since digital devices are generally operated at relatively low voltage and currents. Moreover, transistors having gate widths in the range of $4\lambda$ are easily identifiable in a digital circuit layout and can potentially lead a trained eye to the POR circuit within the layout. Hence, in accordance with another embodiment of the present invention, all circuit elements within the POR are designed with having the same dimensions as typical digital device dimensions.

FIG. 6 shows a Schmitt inverter circuit schematic redesigned with devices having digital device dimensions. As can be seen, the $4\lambda$ devices in FIG. 5 are replaced with equivalent two transistor composite structures in which individual transistors have gate widths of $2\lambda$. As a result, when the Schmitt inverter circuit is implemented within a layout, it will appear to be a digital circuit since the devices within it have dimensions in the range of typical digital devices. It should be well understood that other devices or device dimensions can be redesigned in the same manner to give the POR circuit layout the overall appearance of a digital circuit.

In the preceding description, specific details are set forth, such as the number of cycles counted or detector input voltage trip point, in order to provide a thorough understanding of the present invention. It will be apparent, however, to one skilled in the art that these specific details need not be employed to practice the present invention. In other instances, well-known logic gates and structures have not been described in detail in order to avoid unnecessarily obscuring the present invention.

Moreover, although the elements of the present invention have been described in conjunction with certain embodiments, it is appreciated that the invention can be implemented in a variety of other ways. Consequently, it is to be understood that the particular embodiments shown and described by way of illustration is in no way intended to be considered limiting. Reference to the details of these embodiments is not intended to limit the scope of the claims which themselves recite only those features regarded as essential to the invention.

What is claimed is:

1. A digital integrated circuit (IC) layout comprising:

a first layout area in said IC layout corresponding to a power-on-reset circuit having an input coupled to a power supply input of said IC layout and having an output for generating a reset signal, said first layout area being implemented using standardized digital cells and routed using a standarized routing technique;

a second layout area in said IC layout corresponding to the remainder of the digital IC, said second layout area being coupled to said reset signal and said power supply signal, said second layout area being implemented using standardized digital cells and routed using a standardized routing technique;

wherein said first layout area is essentially non-discernible from said second layout area;

wherein high current and high voltage devices in said power-on-reset circuit are implemented within said first layout by device layouts having essentially the same layout dimensions as digital device layouts in said second layout area.

2. A circuit for generating a power-on-reset signal in a digital integrated circuit layout having an associated set of standardized digital layout cells and standardized routing and having an associated power supply which is ramped to its full power, said circuit comprising:

a first means for detecting when said power supply is at a predetermined level and outputting a signal indicating said predetermined level has been reached;

a second means for providing a digital oscillation signal when said predetermined level has been reached;

a third means for causing said power-on-reset signal to be asserted after a predetermined number of digital oscillation signal cycles;

said first, second, and third means being implemented in said digital integrated circuit layout using essentially only said standardized digital layout cells and standardized routing wherein high current and high voltage devices in said circuit are implemented within said first layout by device layouts having essentially the same layout dimensions as said standardized digital layout cells such that said first, second and third means are visually non-discernible within said digital integrated circuit layout.

3. The circuit as described in claim 2 wherein said second means further includes means for enabling a digital oscillation signal generator in response to said level reached signal and means for disabling said digital oscillation signal generator after said predetermined number of digital oscillation signal cycles have occurred.

4. The circuit as described in claim 3 wherein said third means further includes means for generating a control signal after said predetermined number of oscillation signal cycles have occurred, wherein in response to said control signal said digital oscillation signal generator is disabled and said power-on-reset signal is asserted.

5. The circuit as described in claim 4 wherein said digital oscillation signal generator is a ring oscillator.

6. The circuit as described in claim 4 wherein said third means comprises a shift register including a plurality of series coupled flip-flops having their clock inputs coupled to said digital oscillation signal.

7. A circuit for generating a power-on-reset signal in a digital integrated circuit layout having an associated set of standardized digital layout cells and standardized routing and having an associated power supply which is ramped to its full power, said circuit comprising:

a voltage level detector for detecting when said power supply is at a predetermined level and outputting a signal indicating said predetermined level has been reached;

a latch having a set input coupled to said level reached signal and its reset input coupled to a first control signal, said latch having a non-inverted output and an inverted output;

a first logic circuit having a first input coupled to said inverted output of said latch and having a second input coupled to the inverse of said level reached signal and having an output for providing a second control signal;

a digital oscillation signal generator responsive to said second control signal and outputting a digital oscillation signal when said predetermined level is reached;

a second logic circuit responsive to said digital oscillation signal such that after a predetermined number of cycles of said digital oscillation signal, said second logic circuit outputs said first control signal;

wherein after said predetermined number of cycles, said non-inverted output of said latch outputs said power-on-reset signal in response to said first control signal and said second control signal causes said digital oscillation signal generator to be disabled.

8. The circuit as described in claim 7 wherein said digital oscillation signal generator is a ring oscillator having its enable input coupled to said second control signal.

9. The circuit as described in claim 7 wherein said first logic circuit is a NOR gate having one input coupled to the inverse of said level reached signal, another input coupled to said inverted output of said latch, and its output providing said second control signal.

10. The circuit as described in claim 7 wherein said second logic circuit includes a group of series coupled D flip-flops having their clocking inputs coupled to said oscillation means and each of their outputs coupled to a third logic circuit, wherein when the outputs of said flip-flops are in a predetermined state, said third logic circuit outputs said first control signal.

11. The circuit as described in claim 10 wherein said level reached signal is coupled to the reset input of each of said flip-flops.

12. A method for designing a reset circuit and a corresponding layout of said reset circuit for implementing within a digital integrated circuit(IC) device layout having an associated power supply voltage comprising the steps of:

designing said reset circuit in digital circuit elements;

utilizing standardized digital circuit layout cells in said digital IC layout to implement said reset circuit wherein high current and high voltage devices in said reset circuit are implemented by device layouts having essentially the same layout dimensions as digital device layouts in said digital IC layout;

routing said standardized digital circuit layout cells using standardized layout routing wherein said layout of said reset circuit is essentially visually non-discernible within said digital IC layout.

* * * * *